United States Patent
Swillam et al.

(10) Patent No.: US 12,135,505 B2
(45) Date of Patent: Nov. 5, 2024

(54) SPECTROMETRIC METROLOGY SYSTEMS BASED ON MULTIMODE INTERFERENCE AND LITHOGRAPHIC APPARATUS

(71) Applicant: ASML Holding N.V., Veldhoven (NL)

(72) Inventors: Mohamed Swillam, Wilton, CT (US); Justin Lloyd Kreuzer, Trumbull, CT (US); Stephen Roux, New Fairfield, CT (US)

(73) Assignee: ASML Holding N.V., Veldhoven (NL)

(*) Notice: Subject to any disclaimer, the term of this patent is extended or adjusted under 35 U.S.C. 154(b) by 110 days.

(21) Appl. No.: 18/016,225

(22) PCT Filed: Jun. 29, 2021

(86) PCT No.: PCT/EP2021/067910
§ 371 (c)(1),
(2) Date: Jan. 13, 2023

(87) PCT Pub. No.: WO2022/012927
PCT Pub. Date: Jan. 20, 2022

(65) Prior Publication Data
US 2023/0273531 A1   Aug. 31, 2023

Related U.S. Application Data

(60) Provisional application No. 63/052,651, filed on Jul. 16, 2020.

(51) Int. Cl.
*G03F 7/00* (2006.01)

(52) U.S. Cl.
CPC .... *G03F 7/706845* (2023.05); *G03F 7/70233* (2013.01); *G03F 7/706849* (2023.05); *G03F 7/706851* (2023.05)

(58) Field of Classification Search
CPC .......... G03F 7/70233; G03F 7/706845; G03F 7/706849; G03F 7/706851; G03F 7/70633; G03F 9/7088; G03F 9/7092
See application file for complete search history.

(56) References Cited

U.S. PATENT DOCUMENTS

| 6,297,876 B1 | 10/2001 | Bornebroek |
| 6,803,993 B2 | 10/2004 | Neijzen et al. |

(Continued)

FOREIGN PATENT DOCUMENTS

| TW | 2019-37314 A | 9/2019 |
| TW | 2019-45870 A | 12/2019 |

(Continued)

OTHER PUBLICATIONS

International Search Report and Written Opinion of the International Searching Authority directed to International Patent Application No. PCT/EP2021/067910, mailed Oct. 21, 2021; 11 pages.

(Continued)

*Primary Examiner* — Deoram Persaud
(74) *Attorney, Agent, or Firm* — Sterne, Kessler, Goldstein & Fox P.L.L.C.

(57) ABSTRACT

A metrology system comprises a radiation source, an optical element, first and second detectors, an integrated optical device comprising a multimode waveguide, and a processor. The radiation source generates radiation. The optical element directs radiation toward a target to generate scattered radiation from the target. The first detector receives a first portion of the scattered radiation and generates a first detection signal based on the received first portion. The multimode waveguide interferes a second portion of the scattered radiation using modes of the multimode waveguide. The second detector receives the interfered second portion and generates a second detection signal based on the received interfered second portion. The processor receives (Continued)

the first and second detection signals. The processor analyzes the received first portion, the received interfered second portion, and a propagation property of the multimode waveguide. The processor determines the property of the target based on the analysis.

20 Claims, 6 Drawing Sheets

(56) References Cited

U.S. PATENT DOCUMENTS

| | | | |
|---|---|---|---|
| 6,961,116 | B2 | 11/2005 | Den Boef et al. |
| 7,511,799 | B2 | 3/2009 | Tel et al. |
| 8,706,442 | B2 | 4/2014 | Mos et al. |
| 10,690,995 | B2 | 6/2020 | Kumar et al. |
| 11,175,593 | B2 | 11/2021 | Huisman et al. |
| 11,181,828 | B2 | 11/2021 | Warnaar et al. |
| 2005/0243311 | A1* | 11/2005 | Kellie .................... G01N 21/47 356/239.1 |
| 2008/0008418 | A1* | 1/2008 | Smith ................... G01N 21/648 385/32 |
| 2008/0018874 | A1 | 1/2008 | Dusa et al. |
| 2009/0195768 | A1 | 8/2009 | Bijnen et al. |
| 2011/0310388 | A1 | 12/2011 | Hill et al. |
| 2015/0133778 | A1* | 5/2015 | Barriga Rivera ...... A61B 5/444 600/427 |
| 2015/0234290 | A1* | 8/2015 | Mathijssen ........... G03F 9/7088 356/485 |
| 2015/0355554 | A1* | 12/2015 | Mathijssen ........... G03F 9/7046 356/614 |
| 2021/0132509 | A1* | 5/2021 | Huisman ............. G03F 7/70641 |
| 2023/0058714 | A1* | 2/2023 | Reijnders ............ G03F 7/70633 |
| 2024/0027913 | A1* | 1/2024 | Sokolov ............... G03F 7/70633 |

FOREIGN PATENT DOCUMENTS

| | | |
|---|---|---|
| TW | 2020-24779 A | 7/2020 |
| WO | WO 2013/188520 A2 | 12/2013 |
| WO | WO 2020/043582 A1 | 3/2020 |
| WO | WO 2020/126810 A1 | 6/2020 |

OTHER PUBLICATIONS

French et al., "Snapshot fiber spectral imaging using speckle correlations and compressive sensing," Optics Express, vol. 26, No. 24, Nov. 26, 2018; 14 pages.

Liew et al., "Broadband multimode fiber spectrometer," Optics Letters, vol. 41, No. 9, May 1, 2016; pp. 2029-2032.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Journal of Vacuum Science & Technology B: Microelectronics and Nanometer Structures Processing, Measurement, and Phenomena, vol. 15, Mar. 1997; pp. 361-368.

Redding et al., "High-resolution and broadband all-fiber spectrometers," Optica, vol. 1, No. 3, Sep. 2014; pp. 175-180.

* cited by examiner

SPECTROMETRIC METROLOGY SYSTEMS BASED ON MULTIMODE INTERFERENCE AND LITHOGRAPHIC APPARATUS

CROSS-REFERENCE TO RELATED APPLICATIONS

This application claims priority of U.S. Provisional Patent Application No. 63/052,651, which was filed on Jul. 16, 2020, and which is incorporated herein in its entirety by reference.

FIELD

The present disclosure relates to metrology systems, for example, an alignment sensor for determining positions of features on a substrate in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay (OV) error.

In order to monitor the lithographic process, parameters of the patterned substrate are measured. Parameters may include, for example, the OV error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or OV error between two layers formed in or on the patterned substrate. Properties of the substrate can be determined by comparing the properties of an illumination beam before and after the beam has been reflected or scattered by the substrate.

To minimize the magnitude of OV errors, the position of features on a substrate should be measured to a high degree of accuracy. To do so, a multitude of targets are printed on a substrate and then measured using a plurality of wavelengths several times during lithographic processes. Increasing the number of measured targets enhances the positional awareness of the features on the substrate. However, it is also desirable to perform the measurements quickly in order to increase the rate of high volume manufacturing. Existing metrology solutions that can measure multiple wavelengths simultaneously tend to be large, having dimensions roughly in the order of meters. The large metrology systems occupy footprint that could otherwise be used by lithographic devices to increase high volume manufacturing output.

SUMMARY

Accordingly, it is desirable to develop a high throughput metrology system capable of measuring targets at all desired wavelengths while also providing a smaller footprint than existing metrology systems.

In some embodiments, a metrology system comprises a radiation source, an optical element, first and second detectors, an integrated optical device comprising a multimode waveguide, and a processor. The radiation source is configured to generate radiation. The optical element is configured to direct the radiation toward a target to generate scattered radiation from the target. The first detector is configured to receive a first portion of the scattered radiation and to generate a first detection signal based on the received first portion. The multimode waveguide is configured to interfere a second portion of the scattered radiation using modes of the multimode waveguide. The second detector is configured to receive the interfered second portion and to generate a second detection signal based on the received interfered second portion. The processor is configured to receive the first and second detection signals. The processor is further configured to perform an analysis of the received first portion, the received interfered second portion, and a propagation property of the multimode waveguide. The processor is further configured to determine a property of the target based on the analysis.

In some embodiments, a lithographic apparatus comprises an illumination system, a projection system, and a metrology system. The metrology system comprises a radiation source, an optical element, first and second detectors, a multimode waveguiding device, and a processor. The illumination system is configured to illuminate a pattern of a patterning device. The projection system is configured to project an image of the pattern onto a substrate. The radiation source is configured to generate radiation. The optical element is configured to direct the radiation toward a target on the substrate to generate scattered radiation from the target. The first detector is configured to receive a first portion of the scattered radiation and to generate a first detection signal based on the received first portion. The multimode waveguiding device is configured to interfere a second portion of the scattered radiation using modes of the multimode waveguiding device. The second detector is configured to receive the interfered second portion and to generate a second detection signal based on the received interfered second portion. The processor is configured to receive the first and second detection signals. The processor is further configured to perform an analysis of the received first portion, the received interfered second portion, and a propagation property of the multimode waveguiding device. The processors is further configured to determine a property of the target based on the analysis.

In some embodiments, a metrology system comprise a radiation source, an optical element, an integrated optical device comprising a multimode waveguide, a detector, and a processor. The radiation source is configured to generate radiation. The optical element is configured to direct the radiation toward a target to generate scattered radiation from the target. The multimode waveguide is configured to interfere the scattered radiation using modes of the multimode waveguide. The detector is configured to receive the interfered scattered radiation and to generate a detection signal based on the received interfered scattered radiation. The processor is configured to receive the detection signal. The processor is further configured to perform an analysis based on the received interfered scattered radiation and a propagation property of the multimode waveguide. The processor is further configured to determine a property of the target based on the analysis.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
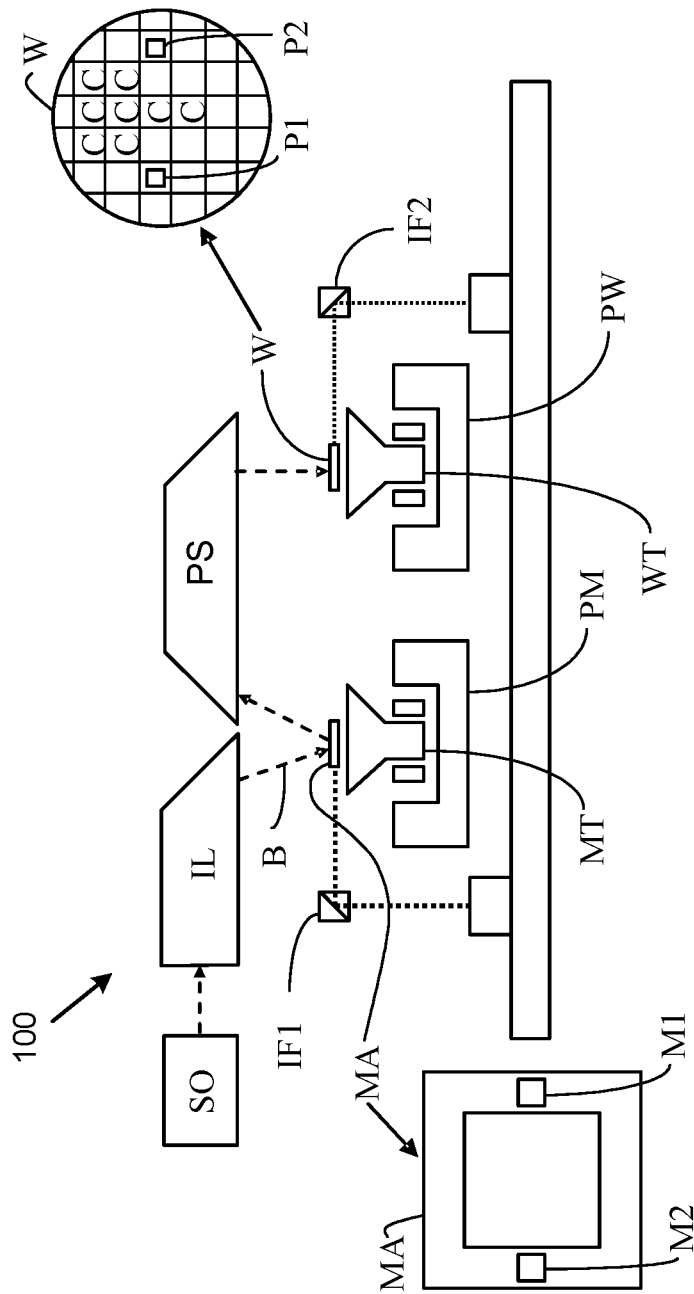
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/ or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
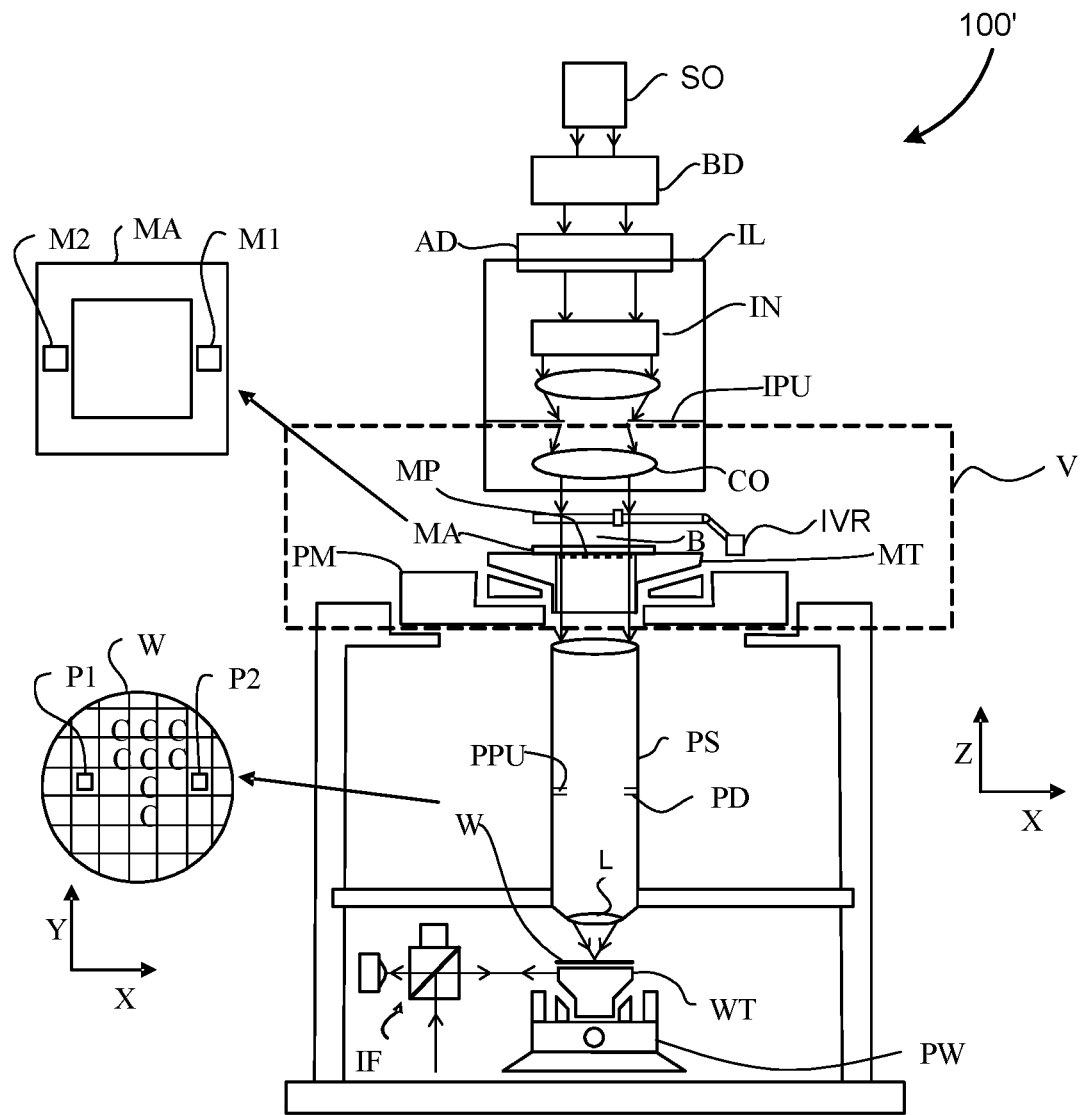
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The terms "inspection apparatus," "metrology apparatus," and the like may be used herein to refer to, e.g., a device or system used for measuring a property of a structure (e.g., OV error, critical dimension parameters) or used in a lithographic apparatus to inspect an alignment of a wafer (e.g., alignment apparatus).

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
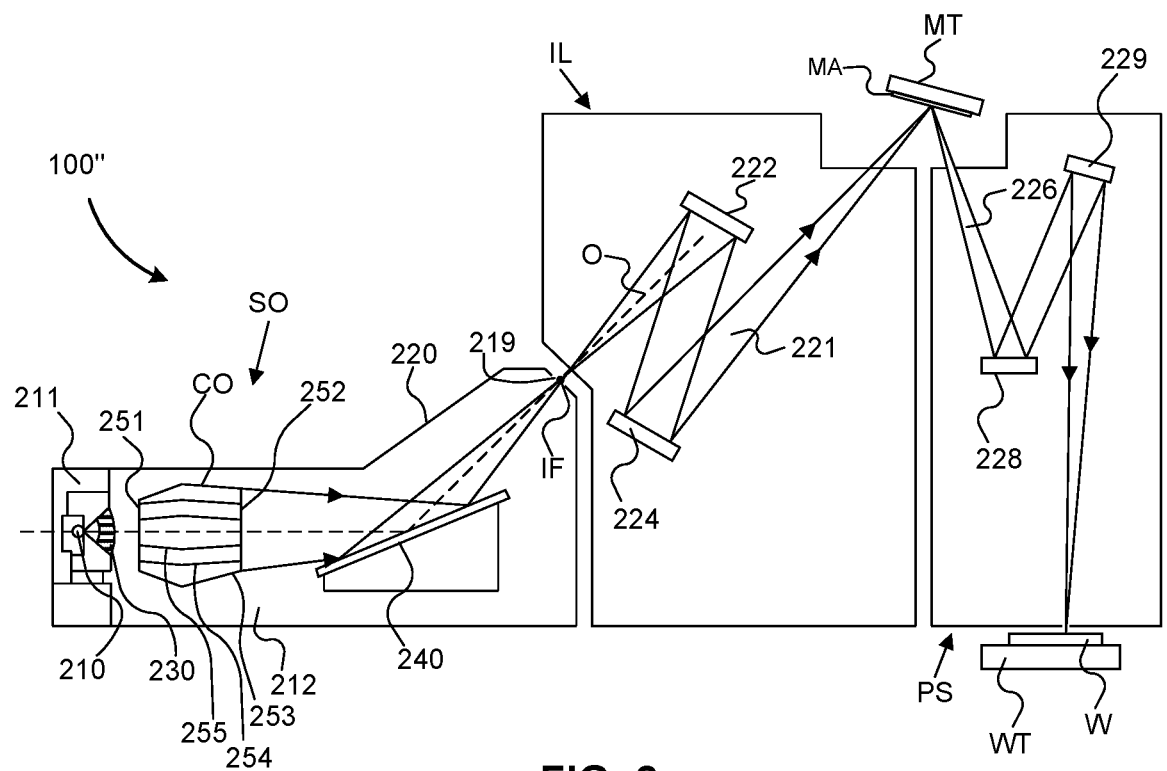
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be used for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
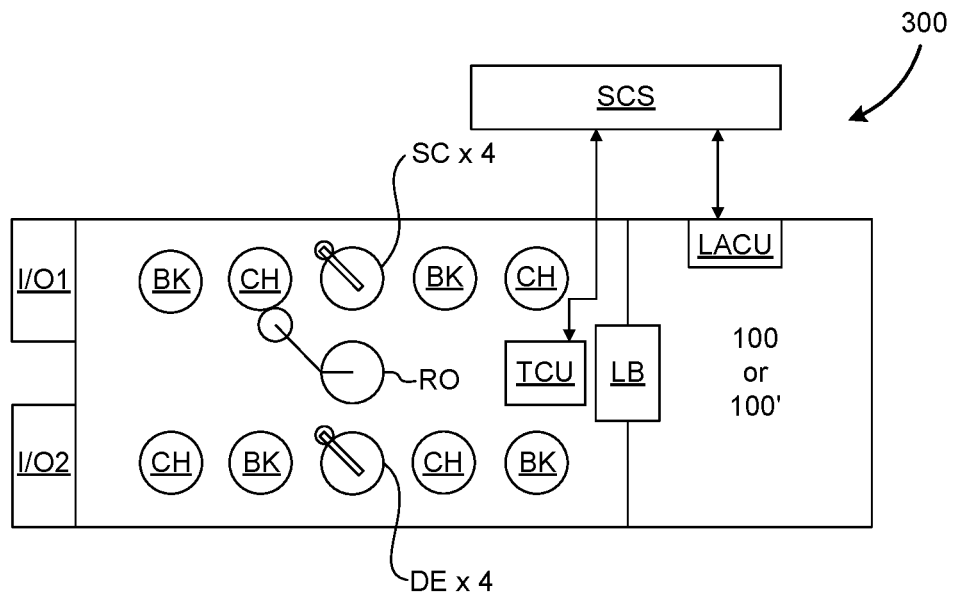
FIG. 3 shows a schematic of a lithographic cell, according to some embodiments.

FIG. 3 shows a lithographic cell 300, also sometimes referred to as a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Metrology System

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
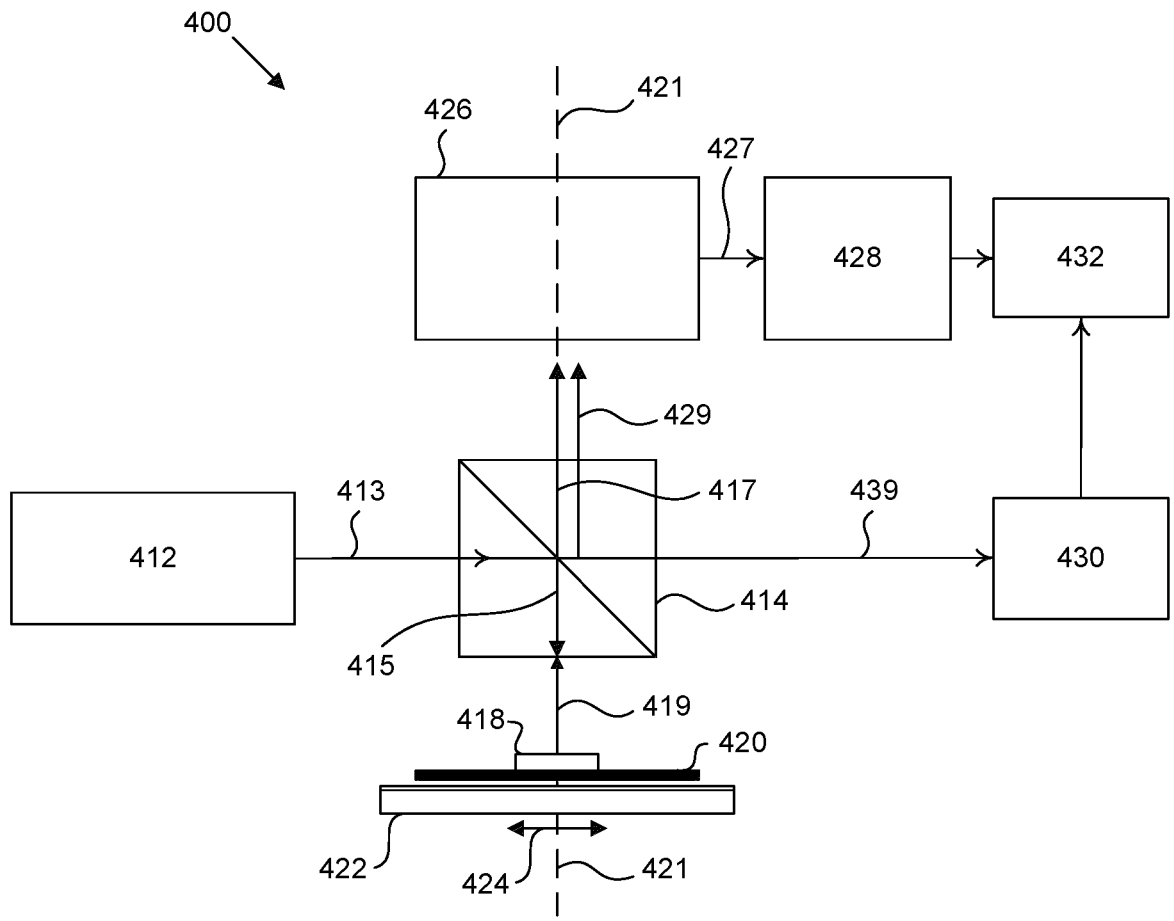
FIGS. 4A and 4B show schematics of inspection apparatuses, according to some embodiments.

FIG. 4A shows a schematic of a cross-sectional view of an metrology system 400 that can be implemented as a part of lithographic apparatus 100 or 100', according to some embodiments. In some embodiments, metrology system 400 can be configured to align a substrate (e.g., substrate W) with respect to a patterning device (e.g., patterning device MA). Metrology system 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, metrology system 400 can include an illumination system 412, a beam splitter 414, an interferometer 426, a detector 428, a beam analyzer 430, and an OV calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., metrology system 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an OV target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and un-rotated images interferometrically.

In some embodiments, detector 428 can be configured to receive the recombined image via interferometer signal 427 and detect interference as a result of the recombined image when alignment axis 421 of metrology system 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can, for example, be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of metrology system 400 or any other reference element such that the center of symmetry of alignment mark or target 418 can be known with reference to metrology system 400 or any other reference element. Beam analyzer 430 can be a point or an imaging polarimeter with some form of wavelength-band selectivity. In some embodiments, beam analyzer 430 can be directly integrated into metrology system 400, or connected via fiber optics of several types: polarization preserving single mode, multimode, or imaging, according to other embodiments.

In some embodiments, beam analyzer 430 can be further configured to determine the OV data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured OV data can also indicate an offset between the reference pattern and the exposure pattern. The measured OV data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure OV, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an OV parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
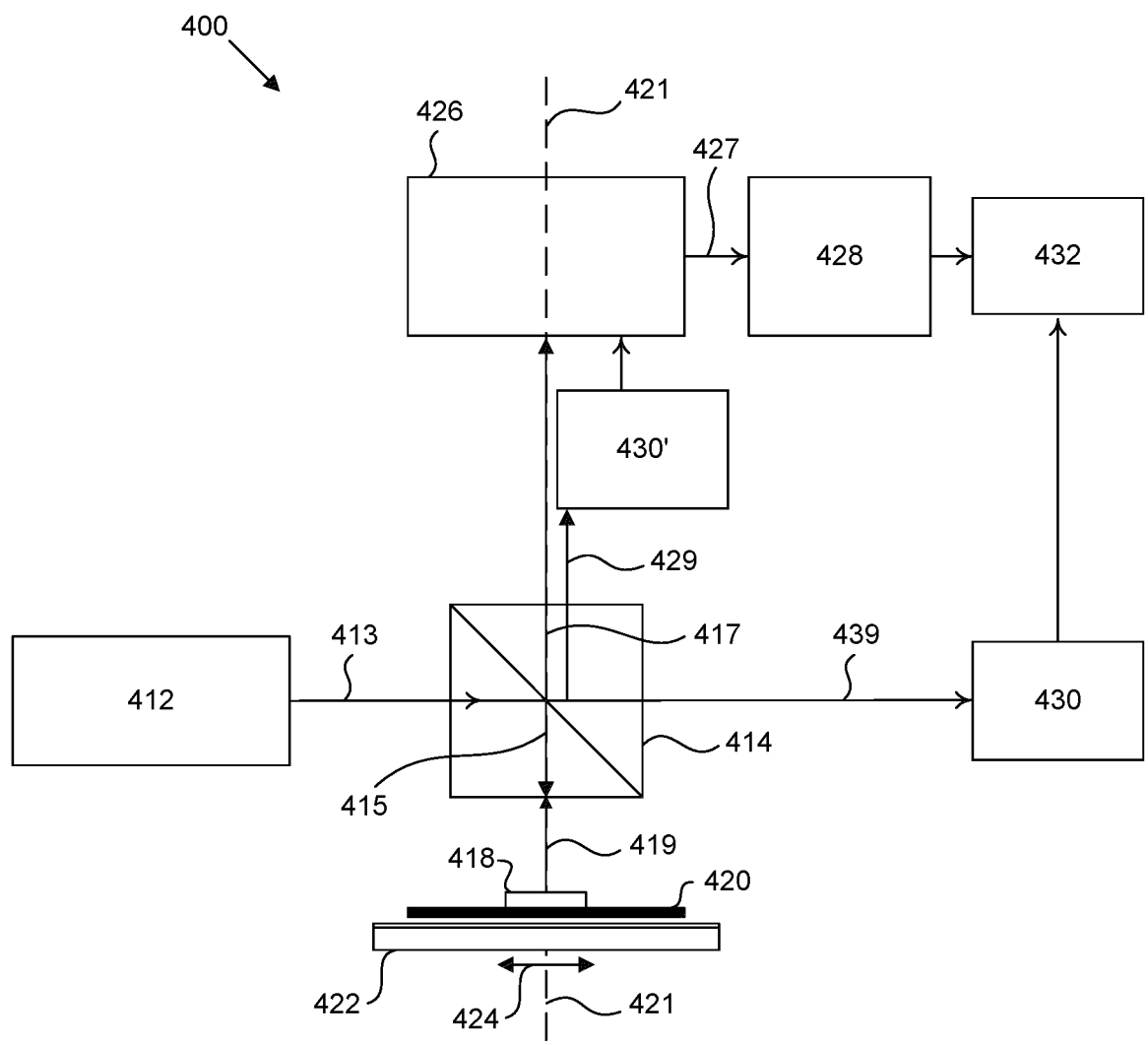

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of metrology system 400, or any other reference element, such that the center of symmetry of alignment mark or target 418 can be known with reference to metrology system 400, or any other reference element. Second beam analyzer 430' can be further configured to determine the OV data between two patterns and a model of the product stack profile of substrate 420. Second beam analyzer 430' can also be configured to measure OV, critical dimension, and focus of target 418 in a single measurement.

In some embodiments, second beam analyzer 430' can be directly integrated into metrology system 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an OV calculation processor. The information can comprise a model of the product stack profile constructed by beam analyzer 430. Alternatively, processor 432 can construct a model of the product mark profile using the received information about the product mark. In either case, processor 432 constructs a model of the stacked product and OV mark profile using or incorporating a model of the product mark profile. The stack model is then used to determine the OV offset and minimizes the spectral effect on the OV offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the metrology system 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of OV, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on OV measurement, the position estimates, and additional optical stack process information associated with each set of offset errors. The OV is calculated for a number of different marks, for example, OV targets having a positive and a negative bias around a programmed OV offset. The target that measures the smallest OV is taken as reference (as it is measured with the best accuracy). From this measured small OV, and the known programmed OV of its corresponding target, the OV error can be deduced. Table 1 illustrates how this can be performed. The smallest measured OV in the example shown is −1 nm. However this is in relation to a target with a programmed OV of −30 nm. Therefore, it can be deduced that the process may have introduced an OV error of 29 nm.

TABLE 1

| Programmed OV | −70 | −50 | −30 | −10 | 10 | 30 | 50 |
|---|---|---|---|---|---|---|---|
| Measured OV | −38 | −19 | −1 | 21 | 43 | 66 | 90 |
| Difference between measured and programmed OV | 32 | 31 | 29 | 31 | 33 | 36 | 40 |
| OV error | 3 | 2 | — | 2 | 4 | 7 | 11 |

The smallest value can be taken to be the reference point and, relative to this, the offset can be calculated between measured OV and that expected due to the programmed OV. This offset determines the OV error for each mark or the sets of marks with similar offsets. Therefore, in the Table 1 example, the smallest measured OV was −1 nm, at the target position with programmed OV of 30 nm. The difference between the expected and measured OV at the other targets is compared to this reference. A table such as Table 1 can also be obtained from marks and target 418 under different illumination settings, the illumination setting, which results in the smallest OV error, and its corresponding calibration factor, can be determined and selected. Following this, processor 432 can group marks into sets of similar OV error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the OV, for example, by feeding corrections into the metrology system 400.

Exemplary Integrated Spectrometer

Lithographic production of ICs demand ever increasing fabrication speeds and throughput, as well as nanometer or sub-nanometer precision. As a consequence, the IC industry desires ever faster and more accurate metrology tools for monitoring lithographic processes. It is often the case that increasing speed of measurement reduces precision and vice versa. For example, multiple wavelengths can be used to increase the information (more precision) gleaned from a measurement. Light-matter interaction (e.g., illumination on a semiconductor structure) can vary depending on the wavelength/frequency of the illumination. The differing wavelength responses can reveal additional information about the measured structure, improving the accuracy of the measurement. However, the use of multiple wavelengths can cause a metrology system to operate slower, particularly for metrology systems that use wavelengths sequentially.

To overcome this problem, simultaneous use of wavelengths can be designed for a metrology system, e.g., using wavelength multiplexing or a spectrometer. However, multi-wavelength optical hardware can be undesirable due to size and complexity. Multi-wavelength systems can require large footprints and volume in order to accommodate all the necessary optical hardware (e.g., beam splitters, optical fibers, focusing lenses, gratings, and the like). Large-footprint metrology systems can detrimentally occupy valuable space in a fab facility, increasing production costs and reducing fabrication throughput. More footprint dedicated to metrology reduces the footprint that can be dedicated to fabrication. Therefore, it is desirable to provide fast, accurate, compact metrology tools. Described in embodiments herein are structures and functions for compact, fast, and precise metrology systems.

Figure 5:
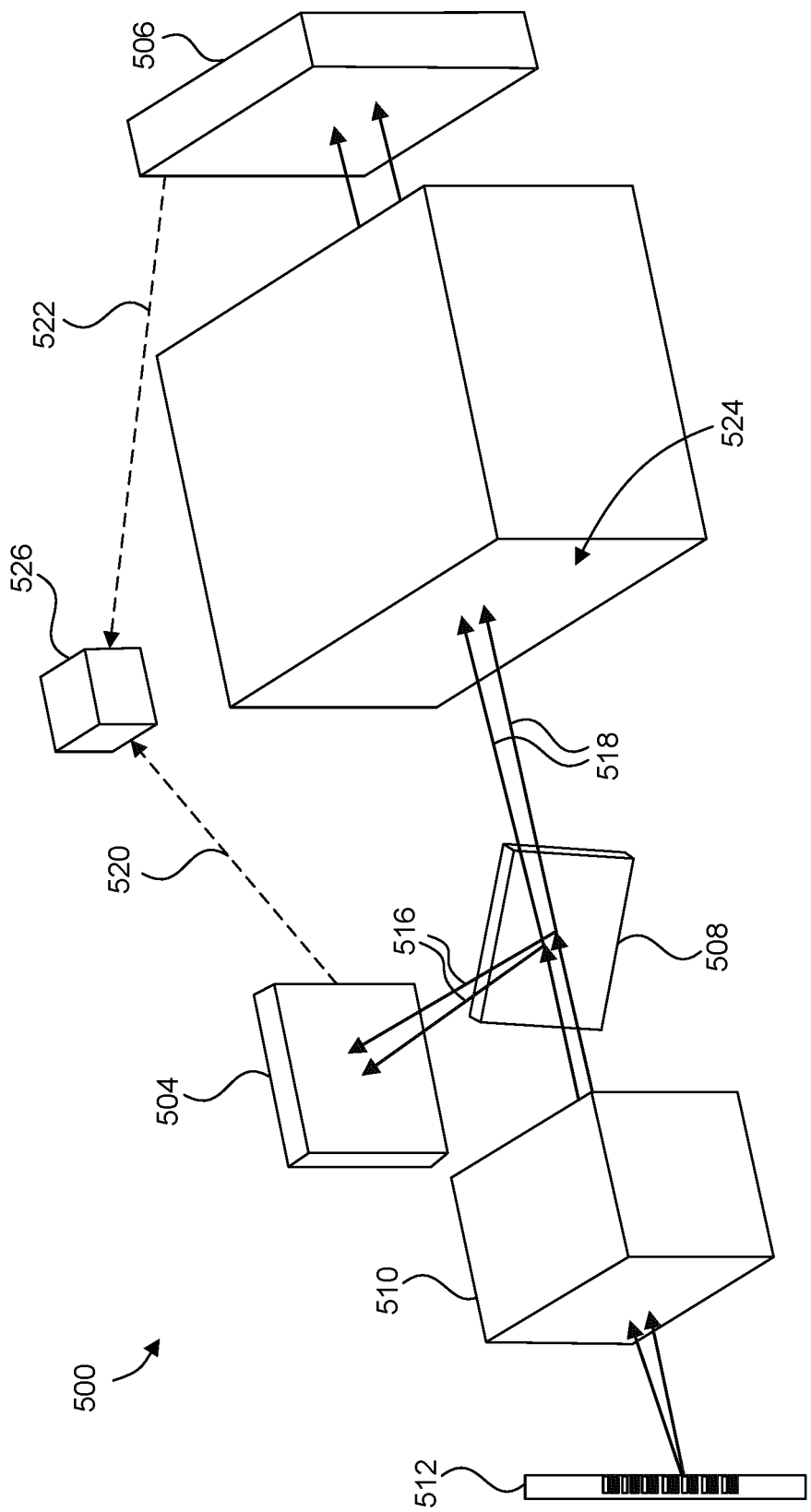
FIG. 5 shows a metrology system, according to some embodiments.

FIG. 5 shows a metrology system 500, according to some embodiments. For clarity, only the detection-side setup of metrology system 500 is shown, while the illumination source and associated optical hardware is omitted. In some embodiments, metrology system 500 can use illumination source(s) and associated optical hardware as described for metrology system 400 (e.g., illumination system 412, FIGS. 4A and 4B).

In some embodiments, metrology system 500 comprises a multimode waveguide 502, detectors 504 and 506 (also "first and second detectors"), and a beam-splitting element 508. Multimode waveguide 502, detectors 504 and 506, and/or beam-splitting element 508 can be implemented on a substrate (e.g., integrated optical device, photonic integrated circuit). Multimode waveguide 502 can comprise semiconductor and/or dielectric material (e.g., any of Si-based, Ga-based, Li-based, and the like). For example, the dielectric material can comprise SiN and/or SiO$_2$. Beam-splitting element 508 can comprise a mirror (e.g., dichroic mirror) and/or prism(s).

The term "waveguide" as used herein can refer to a medium for guiding radiation. The terms "fiber," "optical fiber," and the like can refer to a strand of fiber that acts as a waveguide, the fiber having a core and optionally a cladding surrounding the core. The fiber is capable of being structurally rearranged. For example, a fiber wrapped in a coil can be unwrapped to cover larger distances. However, when a waveguide is further modified by terms such as "integrated," "integrated optics," "photonic circuit," and the like, the waveguide is to be considered affixed to a host structure. Unlike a strand of fiber, a waveguide on an integrated optical device is rigidly affixed to the integrated optical device. The waveguide on the integrated optical device has a permanent structural arrangement that is not adjustable.

To provide positional context with respect to elements of metrology system 400 (FIGS. 4A and 4B), in some embodiments, multimode waveguide 502, detectors 504 and 506, and/or beam-splitting element 508 can replace detector 428 (FIGS. 4A and 4B). Optical system 510 can comprise optical elements for directing illumination to different parts of metrology system. For example, beam splitter 414 and/or interferometer 426 (FIGS. 4A and 4B) can be included in optical system 510. Optical system 510 can comprise any of optical fiber(s), waveguide(s), mirror(s), and the like.

In some embodiments, metrology system 500 can perform optical measurements as described for the previously mentioned SMASH alignment sensor (U.S. Pat. No. 6,961,116). For example, metrology system 500 can employ self-referencing interferometry techniques. Additionally, metrology system 500 can use spectrometric techniques to enhance optical measurements.

In some embodiments, a radiation source used in metrology system 500 can generate radiation. An optical element used in metrology system 500 can direct the radiation toward target 512 to generate scattered radiation 514 from target 512 (see FIGS. 4A and 4B and associated text). Optical system 510 can direct scattered radiation 514 toward elements of metrology system 500, for example, toward beam-splitting element 508. Beam-splitting element 508 can split the scattered radiation so as to generate first and second portions 516 and 518 of scattered radiation 514. Detector 506 can receive first portion 516 of scattered radiation 514. Detector 506 can generate a first detection signal 520 based on the received first portion 516 of scattered radiation 514.

In some embodiments, multimode waveguide 502 can receive second portion 518 of scattered radiation 514 using a plurality of modes of the multimode waveguide. For example, second portion 518 of scattered radiation 514 can be spread over an input surface 524 of multimode waveguide 502. Input surface 524 can have a plurality of regions corresponding to different propagation modes of multimode waveguide 502. Multimode waveguide 502 can interfere second portion 518 of scattered radiation 514 that propagates using the modes of multimode waveguide 502. Detector 506 can receive the second portion 518 of scattered radiation 514 after having been transmitted through multimode waveguide 502 (i.e., with the modes interfered). Detector 506 can generate a second detection signal 522 based on the received interfered modes.

In some embodiments, a processor 526 can receive the first and second detection signals to determine a property of the target. The property of the target can be an alignment position of target 512. In some embodiments, the property of the target can be an OV error and/or critical dimension of target 512. Processor 526 can perform an analysis the first and second detection signals. The analysis can comprise a comparison of first portion 516 of scattered radiation 514 received at detector 504 and the interfered modes corresponding to second portion 518 of scattered radiation 514 received at detector 506. Processor 526 can be part of metrology system 500 or part of another apparatus in communication with metrology system 500.

In some embodiments, processor 526 can determine a spatial intensity distribution, as a function of wavelength, of illumination received at detector 506. Detectors 504 and 506 can be an image capture device (e.g., a camera), having a two-dimensional array of detector elements (e.g., pixels). Each detector element can add its pixel information (e.g., detected energy intensity) to the corresponding detection signal. It is to be appreciated that any individual detector element may not be capable of discriminating wavelength and can only convey the aggregate intensity of all wavelengths incident upon the detector element (i.e., detectors 504 and 506 are not color sensitive). However, embodiments described further below discuss wavelength deconstruction techniques using the 'monochromatic' detection signals from detectors 504 and 506. Second portion 518 of scattered radiation 514 can be self-interfered as the different modes within multimode waveguide 502 interact. The spatial intensity distribution output from multimode waveguide 502 can have speckle pattern as a result of the interference. The speckled output from multimode waveguide 502, having multiple wavelengths, is then incident on the face of detector 506 as an image. The information carried by the second detection signal from detector 506 can represent the image having the speckle pattern.

In some embodiments, the interference of modes within multimode waveguide 502 is a highly repeatable process. Therefore, processor 526 can be configured to deconstruct the speckled output of multimode waveguide 502 into its wavelength constituents. That is, the multi-wavelength image detected at detector 506 can be deconstructed into a plurality of single-wavelength images. The images can be displayed on a screen to a user of metrology system 500. The phenomena allowing for wavelength deconstruction lies inside multimode waveguide 502. In multimode waveguide 502, the interference of the modes is sensitivity to wavelength. Some details of wavelength deconstruction can be found in non-patent literature Redding, Brandon, et al. "High-resolution and broadband all-fiber spectrometers." Optica 1.3 (2014): 175-180 (herein "Redding") and Liew, Seng Fatt, et al. "Broadband multimode fiber spectrometer." Optics Letters 41.9 (2016): 2029-2032 (herein "Liew"), both of which are incorporated by reference herein in their entireties.

In some embodiments, the sensitivity to wavelength arises from the fact that the propagation of light inside multimode waveguide is subject to different phase delays depending on the wavelength of light—that is, the refractive index is variable with respect to wavelength. While some materials exhibit a relatively constant refractive index in certain wavelength ranges, even the smallest variations of refractive index can be exploited by prolonging the time light travels in multimode waveguide 502 (e.g., increasing the length of multimode waveguide 502), and thus exacerbating phase delay differences between the wavelengths. The electric field in multimode waveguide 502 is represented by Eq. 1:

$$E(x, y, z) = e^{j\omega t}\sum_m A_m \psi_m(x, y)e^{-j(\beta_m z + \varphi_m)}. \tag{1}$$

Here, the index m represents a distinct mode and wavelength (for simplification, the wavelength dependence is absorbed into the index instead of being explicitly shown as a variable). For example, m=1 can represent a wavelength $\lambda_1$ traveling in mode $TE_{00}$, m=2 can represent a wavelength $\lambda_2$ traveling in mode $TE_{00}$, m=3 can represent a wavelength $\lambda_1$ traveling in mode $TE_{01}$, and so on. $A_m$ and $\varphi_m$ are the amplitude and initial phase of the $m^{th}$ mode-wavelength, respectively. $\psi_m(x, y)$ and $\beta_m$ represent the spatial profile and the propagation constant of the $m^{th}$ mode-wavelength, respectively. The z coordinate represents the light-propagation direction, which can be considered zero at the input and L at the output of multimode waveguide 502. The x, y coordinate represents a position on a plane perpendicular to the z direction. It can be seen that increasing the length L of multimode waveguide 502 increases the phase delay $\beta_m L$ at the output of multimode waveguide 502. The spatial profile $\psi_m(x, y)$ also implies that the speckle pattern (i.e., interference pattern produced by superimposed electric fields) is also sensitive to polarization, as well as position x, y—that is, light can prefer to couple into particular modes of multimode waveguide 502 depending on the incidence position on input surface 524.

In some embodiments, the speckle pattern detected at detector 506 can vary as the wavelength is changed. This is due to the phase delay $\beta_m L$ being a function of wavelength (wavelength dependence is in index m). A small difference in wavelength may not generate a discernable change to the speckle pattern. Therefore, a quantity of interest is the minimum wavelength change that alters the initial speckle pattern into an uncorrelated speckle pattern. A spectral correlation function can be used to represent how fast the speckle pattern changes with respect to wavelength, shown in Eq. 2:

$$C(\Delta\lambda) = \frac{\langle I(x, y, \lambda) I(x, y, \lambda + \Delta\lambda) \rangle}{\langle I(x, y, \lambda)\rangle\langle I(x, y, \lambda + \Delta\lambda) \rangle} - 1. \quad (2)$$

Here, I (x, y, $\lambda$) is the intensity at position x, y and input wavelength $\lambda$. The chevron brackets $\langle\ \rangle$ represent averaging over $\lambda$. It was shown in Liew that, at a wavelength near 1500 nm and for a multimode fiber of 100 m, the half-width-at-half-maximum (HWHM) of the correlation function is $\delta\lambda=0.03$ nm. The speckle pattern correlation is reduced by 50% when changing to a wavelength that is only 0.03 nm different.

In some embodiments, the input/output behavior of multimode waveguide can be characterized by the matrix equation O=T·I (also "transfer function"), where T is a transmission matrix, I is a vector describing the input spectrum, and O is a vector describing the output speckle pattern. In other words, an input I is acted upon by the transmission matrix T to generate an output O. The transmission matrix T is a function of the material and structure of multimode waveguide 502 and can vary based on uncertainties in the fabrication of multimode waveguide 502. For any given construction of multimode waveguide 502, the transmission matrix T can be ascertained via a calibration measurement. For example, a well-defined wavelength and modal distribution can be used as input. In a first order approximation, the scattering properties of target 512 can be known to a high degree of accuracy (e.g., using a calibration grating target). Scattered radiation 514 can be generated using a sequence of wavelengths. The electric field input into multimode waveguide 502 can be characterized by detecting first portion 516 of scattered radiation 514 at detector 504. The electric field output from multimode waveguide 502 can be characterized by detecting second portion 518 of scattered radiation 514 at detector 506. Processor 526 can analyze first and second detection signals 520 and 522 to determine elements of the transmission matrix T that is associated with multimode waveguide 502 based on the analyzing. Processor 526 can also base its analysis on the known scattering properties of the calibration grating target (e.g., angle of diffraction varies predictably as different wavelengths are tested). Once all the elements of the transmission matrix T are determined, metrology system 500 can be considered calibrated and can be used to measure actual target(s) 512 on a product wafer.

In some embodiments, an actual measurement of target 512 is performed by illuminating target 512 using all desired wavelengths simultaneously. On a wafer product with hundreds of alignment marks and only a finite time to measure them (e.g., 5 seconds), using all wavelengths is desirable for allowing fast characterization and maximizing the number of targets that metrology system 500 can measure in the finite time window. Conversely, sequential-wavelength characterization is much slower and reduces the number of targets that can be measured, reducing accuracy. A measurement of target 512 comprises receiving first portion 516 of scattered radiation 514 at detector 504 with all desired wavelengths simultaneously. The measurement further comprises receiving second portion 518 of scattered radiation 514 at detector 506 with all desired wavelengths simultaneously. Processor 526 can deconstruct the wavelength constituents in second portion 518 of scattered radiation 514 based on a comparison of first and second detection signals 520 and 522 and the determined propagation characteristics of multimode waveguide 502 (i.e., transmission matrix T). Processor 526 can determine one or more properties of target 512 (e.g., alignment position) based on the analysis of first and second detection signals 520 and 522. Based on the wavelength deconstruction, processor 526 can generate a plurality of images, each image being associated with each of wavelength that was used to illuminate target 512, respectively.

In some embodiments, First portion 516 can be, for example, 10% of the total energy in scattered radiation 514—a 10/90 split. A range of split rations are envisaged, for example, 10/90 to 50/50. In the event that detector 504 needs more than 10% of photons from scattered radiation 514 for a meaningful detection, the beam-split ratio can be increased in favor of first portion 516, for example, 20/80, 25/75, 30/70, or 40/60. Detector 506 can generate a first detection signal 520 based on the received first portion 516 of scattered radiation 514. It is desirable for detector 506 to receive as many photons as possible to increase signal to noise ratio since it is the output from multimode waveguide 502 that is being wavelength-deconstructed. Detector 504 is responsible for ascertaining an approximate characterization of the input into multimode waveguide 502, and therefore may not require a large percentage split from scattered radiation 514.

In some embodiments, detector 504 can be omitted, for example, in instances where the fabrication of target 512 is highly reproducible (e.g., a design that can be reproduced to high degree of accuracy). In this scenario, the radiation diffracted from target 512 is highly predictable. Therefore, it is possible to infer the input into multimode waveguide 502 rather than measuring it directly using detector 504.

In the present disclosure, it is envisaged that integrated multimode waveguide embodiments (e.g., multimode waveguide 502) can be implemented in metrology systems in general. The integrated multimode waveguide embodiments allow for considerable reduction in cost and size of metrology systems (e.g., from meters down to centimeters). Integrated multimode waveguides are also desirable for their robustness against temperature and shock instabilities compared to their multimode-fiber counterparts. However, embodiments using any multimode waveguiding device (e.g., a multimode fiber or an integrated multimode waveguide with attached fiber(s)) are also envisaged for particular metrology applications, for example, in a metrology system for alignment of a substrate in a lithographic apparatus. The fiber(s) can be used, for example, to route light to a more distant location when designing around spatial constraints of a lithographic apparatus. The functions performed by a multimode fiber can be substantially similar to multimode waveguide 502 described herein.

The embodiments may further be described using the following clauses:

1. A metrology system comprising:
   a radiation source configured to generate radiation;
   an optical element configured to direct the radiation toward a target to generate scattered radiation from the target;
   a first detector configured to receive a first portion of the scattered radiation and to generate a first detection signal based on the received first portion;
   an integrated optical device comprising a multimode waveguide configured to interfere a second portion of the scattered radiation using modes of the multimode waveguide;
   a second detector configured to receive the interfered second portion and to generate a second detection signal based on the received interfered second portion; and
   a processor configured to:
      receive the first and second detection signals;
      perform an analysis of the received first portion, the received interfered second portion, and a propagation property of the multimode waveguide; and
      determine a property of the target based on the analysis.

2. The metrology system of clause 1, wherein the processor is further configured to determine wavelength constituents of the received interfered second portion.

3. The metrology system of clause 2, wherein the determining the property of the target is further based on the determined wavelength constituents.

4. The metrology system of clause 2, wherein:
   the processor is configured to generate images; and
   each of the images respectively corresponds to each of the wavelength constituents.

5. The metrology system of clause 1, wherein the multimode waveguide comprises a semiconductor and/or dielectric material.

6. The metrology system of clause 5, wherein the semiconductor and/or dielectric material is Si-based, Ga-based, or Li-based.

7. The metrology system of clause 5, wherein the dielectric material comprises SiN and/or $SiO_2$.

8. The metrology system of clause 1, further comprising a beam splitting element configured to receive and split the scattered radiation to generate the first and second portions.

9. A lithographic apparatus comprising:
   an illumination system configured to illuminate a pattern of a patterning device;
   a projection system configured to project an image of the pattern onto a substrate; and
   a metrology system comprising:
      a radiation source configured to generate radiation;
      an optical element configured to direct the radiation toward a target on the substrate to generate scattered radiation from the target;
      a first detector configured to receive a first portion of the scattered radiation and to generate a first detection signal based on the received first portion;
      a multimode waveguiding device configured to interfere a second portion of the scattered radiation using modes of the multimode waveguiding device;
      a second detector configured to receive the interfered second portion and to generate a second detection signal based on the received interfered second portion; and
      a processor configured to:
         receive the first and second detection signals;
         perform an analysis of the received first portion, the received interfered second portion, and a propagation property of the multimode waveguiding device; and
         determine a property of the target based on the analysis.

10. The lithographic apparatus of clause 9, wherein the processor is further configured to determine wavelength constituents of the received interfered second portion.

11. The lithographic apparatus of clause 10, wherein the determining the property of the target is further based on the determined wavelength constituents.

12. The lithographic apparatus of clause 10, wherein:
   the processor is configured to generate images; and
   each of the images respectively corresponds to each of the wavelength constituents.

13. The lithographic apparatus of clause 9, wherein the multimode waveguiding device comprises a semiconductor and/or dielectric material.

14. The lithographic apparatus of clause 13, wherein the semiconductor and/or dielectric material is Si-based, Ga-based, or Li-based.

15. The lithographic apparatus of clause 13, wherein the dielectric material comprises SiN and/or $SiO_2$.

16. The lithographic apparatus of clause 9, further comprising a beam splitting element configured to receive and split the scattered radiation to generate the first and second portions.

17. The lithographic apparatus of clause 9, wherein the multimode waveguiding device comprises a multimode waveguide integrated on a substrate.

18. The lithographic apparatus of clause 9, wherein the multimode waveguiding device comprises a multimode fiber.

19. A metrology system comprising:
   a radiation source configured to generate radiation;
   an optical element configured to direct the radiation toward a target to generate scattered radiation from the target;
   an integrated optical device comprising a multimode waveguide configured to interfere the scattered radiation using modes of the multimode waveguide;
   a detector configured to receive the interfered scattered radiation and to generate a detection signal based on the received interfered scattered radiation; and
   a processor configured to:
      receive the detection signal;

perform an analysis based on the received interfered scattered radiation and a propagation property of the multimode waveguide; and determine a property of the target based on the analysis.

20. The metrology system of clause 19, wherein the processor is further configured to determine wavelength constituents of the received interfered scattered radiation.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:
1. A metrology system comprising:
a radiation source configured to generate radiation;

an optical element configured to direct the radiation toward a target to generate scattered radiation from the target;
a first detector configured to receive a first portion of the scattered radiation and to generate a first detection signal based on the received first portion;
an integrated optical device comprising a multimode waveguide configured to interfere a second portion of the scattered radiation using modes of the multimode waveguide;
a second detector configured to receive the interfered second portion and to generate a second detection signal based on the received interfered second portion; and
a processor configured to:
receive the first and second detection signals;
perform an analysis of the received first portion, the received interfered second portion, and a propagation property of the multimode waveguide; and
determine a property of the target based on the analysis.

2. The metrology system of claim 1, wherein the processor is further configured to determine wavelength constituents of the received interfered second portion.

3. The metrology system of claim 2, wherein the determining the property of the target is further based on the determined wavelength constituents.

4. The metrology system of claim 2, wherein:
the processor is configured to generate images; and
each of the images respectively corresponds to each of the wavelength constituents.

5. The metrology system of claim 1, wherein the multimode waveguide comprises a semiconductor and/or dielectric material.

6. The metrology system of claim 5, wherein the semiconductor and/or dielectric material is Si-based, Ga-based, or Li-based.

7. The metrology system of claim 5, wherein the dielectric material comprises SiN and/or $SiO_2$.

8. The metrology system of claim 1, further comprising a beam splitting element configured to receive and split the scattered radiation to generate the first and second portions.

9. A lithographic apparatus comprising:
an illumination system configured to illuminate a pattern of a patterning device;
a projection system configured to project an image of the pattern onto a substrate; and
a metrology system comprising:
a radiation source configured to generate radiation;
an optical element configured to direct the radiation toward a target on the substrate to generate scattered radiation from the target;
a first detector configured to receive a first portion of the scattered radiation and to generate a first detection signal based on the received first portion;
a multimode waveguiding device configured to interfere a second portion of the scattered radiation using modes of the multimode waveguiding device;
a second detector configured to receive the interfered second portion and to generate a second detection signal based on the received interfered second portion; and
a processor configured to:
receive the first and second detection signals;
perform an analysis of the received first portion, the received interfered second portion, and a propagation property of the multimode waveguiding device; and
determine a property of the target based on the analysis.

10. The lithographic apparatus of claim 9, wherein the processor is further configured to determine wavelength constituents of the received interfered second portion.

11. The lithographic apparatus of claim 10, wherein the determining the property of the target is further based on the determined wavelength constituents.

12. The lithographic apparatus of claim 10, wherein:
the processor is configured to generate images; and
each of the images respectively corresponds to each of the wavelength constituents.

13. The lithographic apparatus of claim 9, wherein the multimode waveguiding device comprises a semiconductor and/or dielectric material.

14. The lithographic apparatus of claim 13, wherein the semiconductor and/or dielectric material is Si-based, Ga-based, or Li-based.

15. The lithographic apparatus of claim 13, wherein the dielectric material comprises SiN and/or $SiO_2$.

16. The lithographic apparatus of claim 9, further comprising a beam splitting element configured to receive and split the scattered radiation to generate the first and second portions.

17. The lithographic apparatus of claim 9, wherein the multimode waveguiding device comprises a multimode waveguide integrated on a substrate.

18. The lithographic apparatus of claim 9, wherein the multimode waveguiding device comprises a multimode fiber.

19. A metrology system comprising:
a radiation source configured to generate radiation;
an optical element configured to direct the radiation toward a target to generate scattered radiation from the target;
an integrated optical device comprising a multimode waveguide configured to interfere the scattered radiation using modes of the multimode waveguide;
a detector configured to receive the interfered scattered radiation and to generate a detection signal based on the received interfered scattered radiation; and
a processor configured to:
receive the detection signal;
perform an analysis based on the received interfered scattered radiation and a propagation property of the multimode waveguide; and
determine a property of the target based on the analysis.

20. The metrology system of claim 19, wherein the processor is further configured to determine wavelength constituents of the received interfered scattered radiation.

* * * * *